(12) United States Patent
Tsai et al.

(10) Patent No.: US 12,131,892 B2
(45) Date of Patent: Oct. 29, 2024

(54) OPERATING METHOD OF ETCHING DEVICE

(71) Applicant: NANYA TECHNOLOGY CORPORATION, New Taipei (TW)

(72) Inventors: Feng-Ju Tsai, Hsinchu County (TW); Shyue-Ru Doong, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 264 days.

(21) Appl. No.: 17/643,405

(22) Filed: Dec. 8, 2021

(65) Prior Publication Data

US 2022/0102120 A1 Mar. 31, 2022

Related U.S. Application Data

(62) Division of application No. 16/247,539, filed on Jan. 14, 2019, now abandoned.

(Continued)

(51) Int. Cl.
| | |
|---|---|
| *H01L 21/67* | (2006.01) |
| *B08B 5/02* | (2006.01) |
| *B08B 5/04* | (2006.01) |
| *B08B 9/032* | (2006.01) |
| *B08B 9/035* | (2006.01) |

(Continued)

(52) U.S. Cl.
CPC .......... *H01J 37/32862* (2013.01); *B08B 5/02* (2013.01); *B08B 5/04* (2013.01); *B08B 9/0328* (2013.01); *B08B 9/035* (2013.01); *B08B 15/00* (2013.01); *G03F 7/70933* (2013.01); *H01J 37/3244* (2013.01); *H01J 37/32724* (2013.01); *H01J 37/32834* (2013.01); *H01L 21/0206* (2013.01); *H01L 21/0273* (2013.01); *H01L 21/31138* (2013.01); *H01L 21/67069* (2013.01); *H01J 37/3211* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 4,659,449 A | 4/1987 | Watanabe | |
| 5,145,554 A | 9/1992 | Seki et al. | |

(Continued)

FOREIGN PATENT DOCUMENTS

| | | |
|---|---|---|
| CN | 106663647 A | 5/2017 |
| JP | 2004158781 A | 6/2004 |

(Continued)

OTHER PUBLICATIONS

Machine English Translation of KR 20090043864 A; 2009. (Year: 2009).*

(Continued)

*Primary Examiner* — Shamim Ahmed

(74) *Attorney, Agent, or Firm* — CKC & Partners Co., LLC

(57) ABSTRACT

A method includes the following steps. A wafer is disposed on a wafer-mounting surface of a wafer holder that is disposed in a chamber. The wafer-mounting surface is in parallel with a gravity direction. A gas is flown from a gas source to vacuum sealing device. An inductive coil wrapping around a vacuum sealing device excites the gas into plasma. The plasma is injected to the wafer.

5 Claims, 5 Drawing Sheets

Related U.S. Application Data

(60) Provisional application No. 62/775,370, filed on Dec. 4, 2018.

(51) Int. Cl.
*B08B 15/00* (2006.01)
*G03F 7/00* (2006.01)
*H01J 37/32* (2006.01)
*H01L 21/02* (2006.01)
*H01L 21/027* (2006.01)
*H01L 21/311* (2006.01)

(56) References Cited

U.S. PATENT DOCUMENTS

| | | |
|---|---|---|
| 5,242,539 A | 9/1993 | Kumihashi et al. |
| 2002/0025682 A1 | 2/2002 | Lin |
| 2004/0069225 A1 | 4/2004 | Fairbairn et al. |
| 2004/0173317 A1 | 9/2004 | Tung |
| 2004/0253375 A1 | 12/2004 | Ivanov et al. |
| 2005/0205206 A1 | 9/2005 | Lembersky |
| 2005/0232749 A1 | 10/2005 | Vanderpot et al. |
| 2006/0087793 A1 | 4/2006 | Kim et al. |
| 2009/0289179 A1 | 11/2009 | Chen |
| 2012/0031559 A1 | 2/2012 | Dhindsa et al. |
| 2012/0107524 A1 | 5/2012 | Katano et al. |
| 2014/0206197 A1 | 7/2014 | Nakagawa et al. |
| 2015/0090583 A1 | 4/2015 | Kodaira et al. |
| 2015/0318185 A1 | 11/2015 | Kodaira et al. |
| 2016/0005957 A1 | 1/2016 | Kodaira et al. |
| 2017/0323768 A1* | 11/2017 | Zhang ............... H01J 37/32082 |
| 2019/0035610 A1 | 1/2019 | Yeom et al. |
| 2019/0180986 A1* | 6/2019 | Torii .................... H01L 21/3065 |
| 2019/0198299 A1* | 6/2019 | Watanabe ......... H01L 21/67115 |
| 2019/0371574 A1 | 12/2019 | Hsieh et al. |

FOREIGN PATENT DOCUMENTS

| | | | |
|---|---|---|---|
| JP | 2012097328 A | | 5/2012 |
| KR | 20090043864 A | * | 5/2009 |
| KR | 20170003587 U | * | 10/2017 |
| TW | M260984 | | 4/2005 |
| TW | I375985 B | | 11/2012 |

OTHER PUBLICATIONS

Karen Reinhardt and Werner Kern, § 6.4.3.3 Inductively Coupled Plasma Sources, Handbook of Silicon Wafer Cleaning Technology (2d ed., William Andrew) (Year: 2008).

* cited by examiner

OPERATING METHOD OF ETCHING DEVICE

CROSS-REFERENCE TO RELATED APPLICATION

This application is a Divisional application of the U.S. application Ser. No. 16/247,539, filed on Jan. 14, 2019, which claims priority of U.S. Provisional Application Ser. No. 62/775,370, filed on Dec. 4, 2018, the entirety of which is incorporated by reference herein in their entireties.

BACKGROUND

Technical Field

The present disclosure relates to an operation method of an etching device. More particularly, the present disclosure relates to an operation method of an etching device that is used to perform a dry etching process, such as photoresist stripping.

Description of Related Art

In current semiconductor industry, a dry etching process is generally used to perform photoresist stripping. Moreover, while an operation of transferring a photoresist pattern is performed, the dry (plasma) etching process has an advantage of high accuracy, and thus the plasma etching process is used for processing a large amount of wafers on semiconductor production lines.

However, the plasma etching process often generates a large amount of particles, such as negatively charged by-products generated by chemical mechanisms and attached with electrons due to exposure to the plasma. As a result of the interaction between the magnetic field and the electric field in a chamber, the negatively charged by-products are suspended above the wafer and are not easily to be removed. Therefore, after the plasma etching process is performed, the suspended negatively charged by-products (particles) drop on the top surface of the wafer, thus causing contamination.

SUMMARY

According to some embodiments of the present disclosure, a method includes the following steps. A wafer is disposed on a wafer-mounting surface of a wafer holder that is disposed in a chamber. The wafer-mounting surface is in parallel with a gravity direction. A gas is flown from a gas source to vacuum sealing device. An inductive coil wrapping around a vacuum sealing device excites the gas into plasma. The plasma is injected to the wafer.

In some embodiments, the method further includes performing a purging operation through at least one exhaust pipe connected to the chamber, while the wafer is disposed on the wafer holder.

In some embodiments, the method further includes following steps. The wafer is removed. A clean operation is performed after the wafer is removed.

In some embodiments, performing the clean operation further includes following steps. A purging operation is performed through an exhaust pipe connected to a first end and a second end of the vacuum sealing device. A blocking membrane is disposed between the vacuum sealing device and the chamber, such that the vacuum sealing device is separate from the chamber.

In some embodiments, the exhaust pipe and the vacuum sealing device are made of ceramic materials.

In summary, the disclosure provides a method for performing an etching process. The wafer is disposed on the wafer-mounting surface of the wafer holder, and the wafer-mounting surface of the wafer holder is in parallel with a gravity direction, and thus particles may drop on a side surface of the wafer without dropping on a top surface of the wafer. Therefore, the contamination problem on the top surface of the wafer can be resolved, and performance of the wafer can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
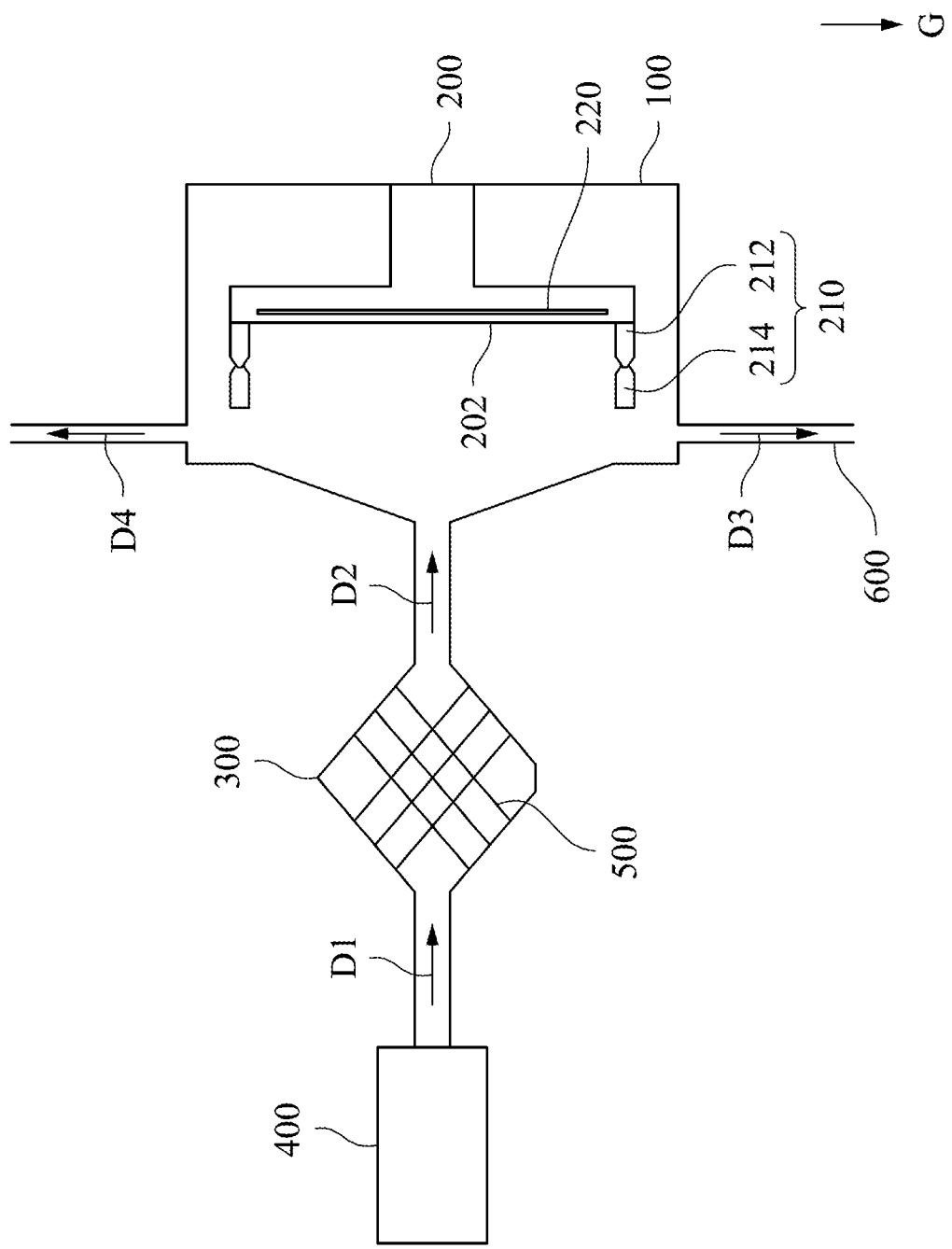
FIG. 1 is a schematic view of an etching device at one operation state in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
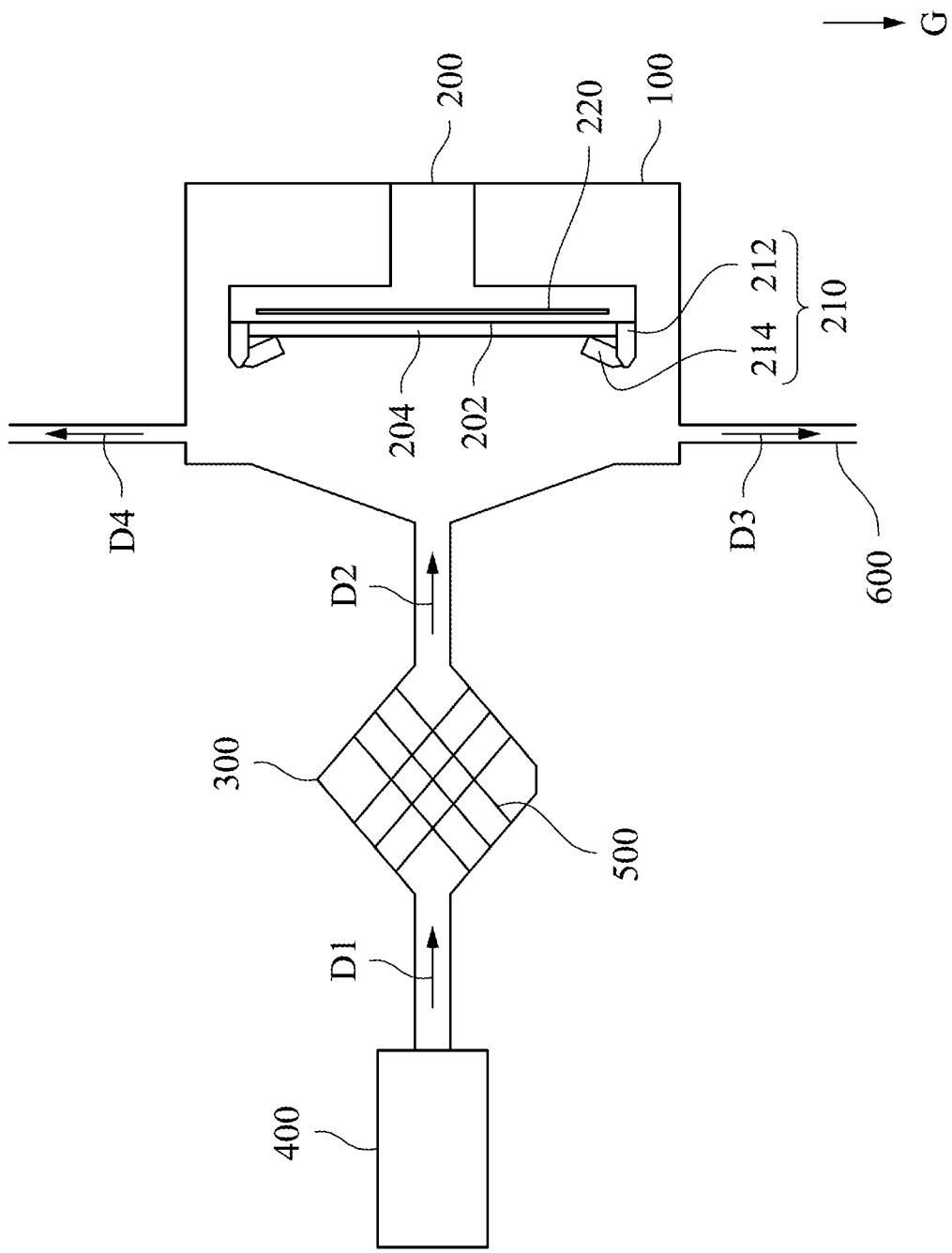
FIG. 2 is a schematic view of the etching device at another operation state in accordance with one embodiment of the present disclosure.

FIG. 1 is a schematic view of an etching device 10 at one operation state accordance with one embodiment of the present disclosure, while FIG. 2 is a schematic view of the etching device 10 at another operation state in accordance with one embodiment of the present disclosure. Referring to FIG. 1, the etching device 10 includes a chamber 100, a wafer holder 200, a vacuum sealing device 300, a gas source 400, and an inductive coil 500. The wafer holder 200 is disposed in the chamber 100. The wafer holder 200 has a wafer-mounting surface 202 in parallel with a gravity direction G.

The vacuum sealing device 300 is connected between the chamber 100 and the gas source 400. As shown in FIG. 1, the gas source 400 may inject gas, e.g., oxygen, into the vacuum sealing device 300 along a direction D1. The inductive coil 500 is wound around the vacuum sealing device 300 to excite the gas into plasma. Then, the plasma is injected into the chamber 100 along a direction D2. In some embodiments, the inductive coil 500 may be a RF inductive coil. The inductive coil 500 is powered from an RF source to supply sufficient electrical energy into the vacuum sealing device 300 to excite the gas therein into the plasma.

In some embodiments, the vacuum sealing device 300 may be made of a ceramic material, but the disclosure is not limited thereto. In other embodiments, the vacuum sealing device 300 may be made of another suitable material. For example, the vacuum sealing device 300 may provide two functions. The ceramic material forms a vacuum wall for maintaining the interior of the vacuum sealing device 300 at sufficiently low pressure for forming the plasma. Moreover, the vacuum sealing device 300 may also act as a dielectric window for allowing RF inductive power to pass from the externally placed inductive coil 500 into the interior of the vacuum sealing device 300. In the present embodiment, the vacuum sealing device 300 is a diamond shape. In other embodiments, the vacuum sealing device 300 is a round shape, a semicircular shape, or another suitable shape.

In some embodiments, the wafer holder 200 has chuck pins 210. The chuck pins 210 are configured to fix a wafer 204 (as shown in FIG. 2) on the wafer-mounting surface 202 of the wafer holder 200. As shown in FIG. 1, the chuck pins 210 are arranged on the wafer-mounting surface 202. Each chuck pin 210 has a first portion 212 and a second portion 214 to clamp the wafer 204 (as shown in FIG. 2), and the second portion 214 is pivotally connected to the first portion 212.

Referring to FIG. 2, FIG. 2 shows another operation state of the wafer 204 fixed on the wafer holder 200 by using the chuck pins 210, and the etching process is performed. In greater detail, the wafer 204 is directly disposed on the wafer-mounting surface 202, and a top surface of the wafer 204 is in parallel with the gravity direction G. As shown in FIG. 2, the second portion 214 moves toward the wafer 204 so as to fix the wafer 204 on the wafer holder 200. For example, an angle between the first portion 212 and the second portion 214 is an acute angle less than 90 degrees so as to be beneficial to fixing the wafer 204. In some embodiments, a surface of the chuck pin 210 is coated with a material to have better contact with the wafer, in which the material may be such as tantalum, silicon carbide, or another suitable material.

In some embodiments, the wafer holder 200 further includes a heater 220 for heating the wafer 204. For example, a power source (not shown) may provide DC power to the heater 220, and the heater 220 may provide radiant energy to the wafer 204.

As shown in FIG. 2, during the etching process such as a plasma dry etching process, the gas source 400 injects the gas into the vacuum sealing device 300 along the direction D1. After the gas flows into the vacuum sealing device 300, the gas is excited to the plasma. The plasma is injected to the wafer 204 in the chamber 100 along the direction D2, in which particles may be generated in the chamber 100. Since the top surface of the wafer 204 is parallel with the gravity direction G, the particles falling on the top surface of the wafer 204 may drop on the sidewall of the chamber 100, thereby making the top surface of the wafer 204 free of the particles, thus improving the performance of the wafer 204.

In the present embodiment, as shown in FIG. 1 and FIG. 2, the etching device 10 further includes at least one exhaust pipe 600 connected to the chamber 100. The exhaust pipes 600 are connected the sidewalls of the chamber 100. In some embodiments, the exhaust pipes 600 may be two or more, but at least one exhaust 600 is disposed near a bottom of the chamber 100. As shown in FIG. 2, a purging operation is performed so as to remove the particles. In greater detail, while the wafer 204 is disposed on the wafer holder 200, the particles are removed through the exhaust pipes 600 along a direction D3 and a direction D4.

Figure 3:
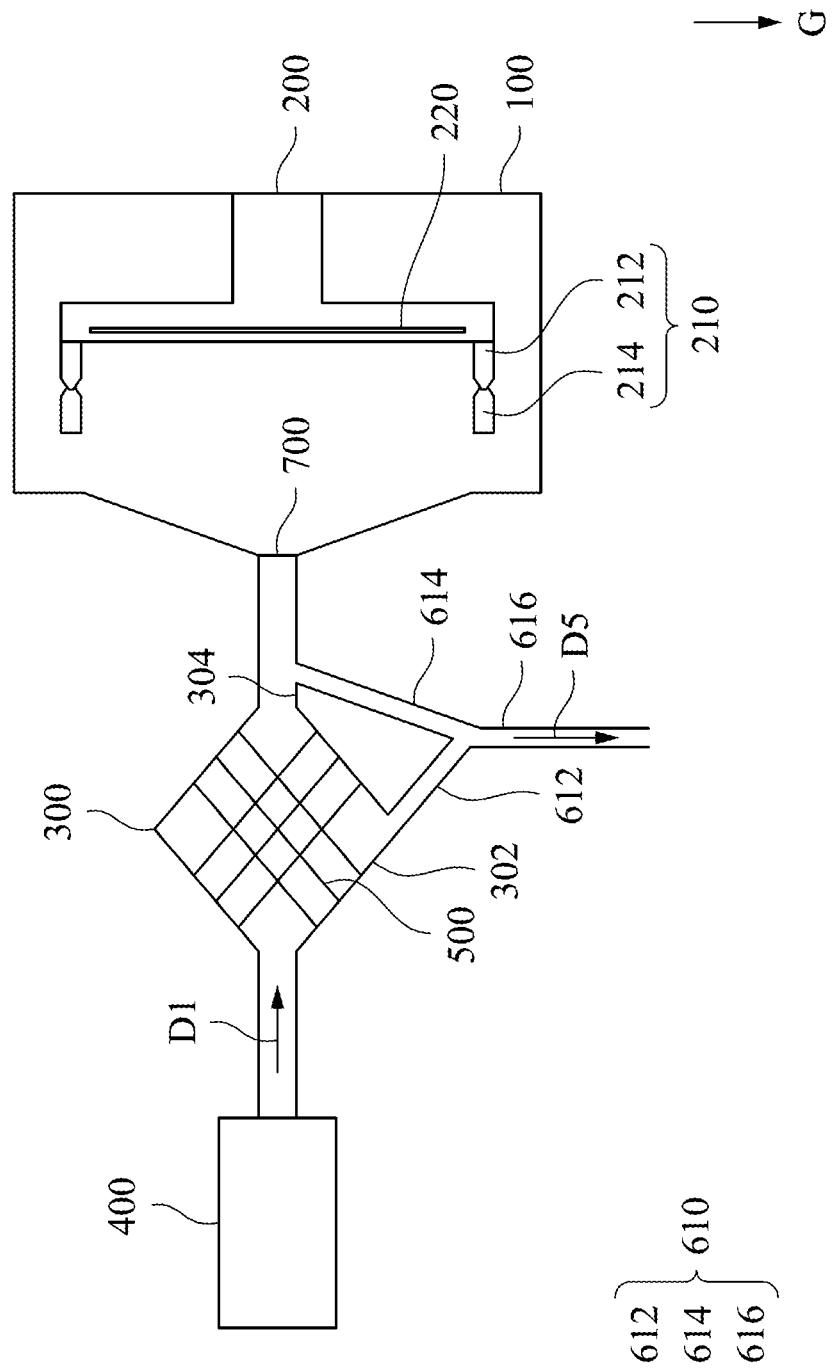
FIG. 3 is a schematic view of the etching device performing a clean operation in accordance with one embodiment of the present disclosure.

FIG. 3 is a schematic view of an etching device 10 for performing a clean operation in accordance with one embodiment of the present disclosure. As shown in FIG. 3, after the wafer 204 of FIG. 2 is removed from the wafer holder 200, the clean operation is performed to prevent the particles from sticking on the surface of the vacuum sealing device 300. The clean operation may include following steps. The purging operation is performed through an exhaust pipe 610 connected to a first end 302 and a second end 304 of the vacuum sealing device 300. A blocking membrane 700 is disposed between the vacuum sealing device 300 and the chamber 100, such that the vacuum sealing device 300 is separated from the chamber 100. In other words, the blocking membrane 700 may restrict the movement of the particles. For example, due to the disposition of the blocking membrane 700, the particles cannot move from the chamber 100 to the vacuum sealing device 300, and cannot move from the vacuum sealing device 300 to the chamber 100 as well.

In some embodiments, the exhaust pipe 610 is Y-shaped, but the disclosure is not limited thereto. For example, the exhaust pipe 610 has a first exhaust pipe 612, a second exhaust pipe 614, and the third exhaust pipe 616. The first end 302 of the vacuum sealing device 300 is connected to the first exhaust pipe 612, while the second end 304 of the vacuum sealing device 300 is connected to the second exhaust pipe 614. As shown in FIG. 3, while the clean operation is performed, the gas source 400 provides the gas, e.g., oxygen, or other gases used to remove the particles from the vacuum sealing device 300. In greater detail, while the etching process is performed, the particles are generated in the chamber 100, and a portion of the particles may flow into the vacuum sealing device 300 from the chamber 100. As a result, the clean operation is performed so as to remove the residue particles in the vacuum sealing device 300. Due to the connection between the vacuum sealing device 300 and the exhaust pipe 610, the particles are removed through the first exhaust pipe 612 and the second exhaust pipe 614, and then the particles are removed through the third exhaust pipe 616 along a direction D5.

In some embodiments, the exhaust pipe 610 is made of a ceramic material. In other embodiments, the vacuum sealing device 300 and the exhaust pipe 610 are made of same materials, but the disclosure is not limited thereto. For example, the vacuum sealing device 300 and the exhaust pipe 610 are made of the ceramic material which is beneficial for removing the particles. In some embodiments, the exhaust pipe 610 is connected to a negative pressure source which is beneficial to performing the purging operation.

Figure 4:
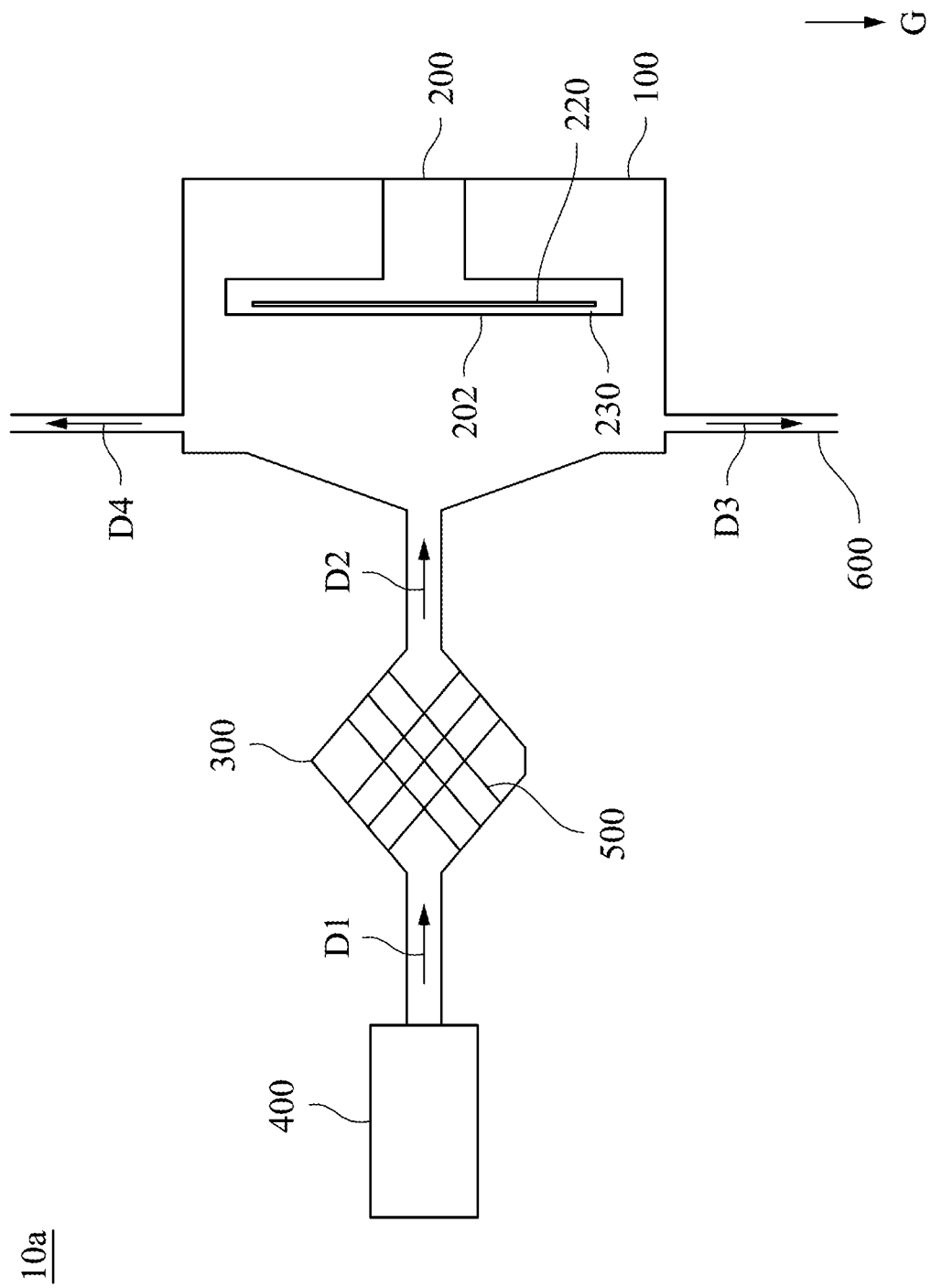
FIG. 4 is a schematic view of the etching device at one operation state in accordance with another embodiment of the present disclosure.
Figure 5:
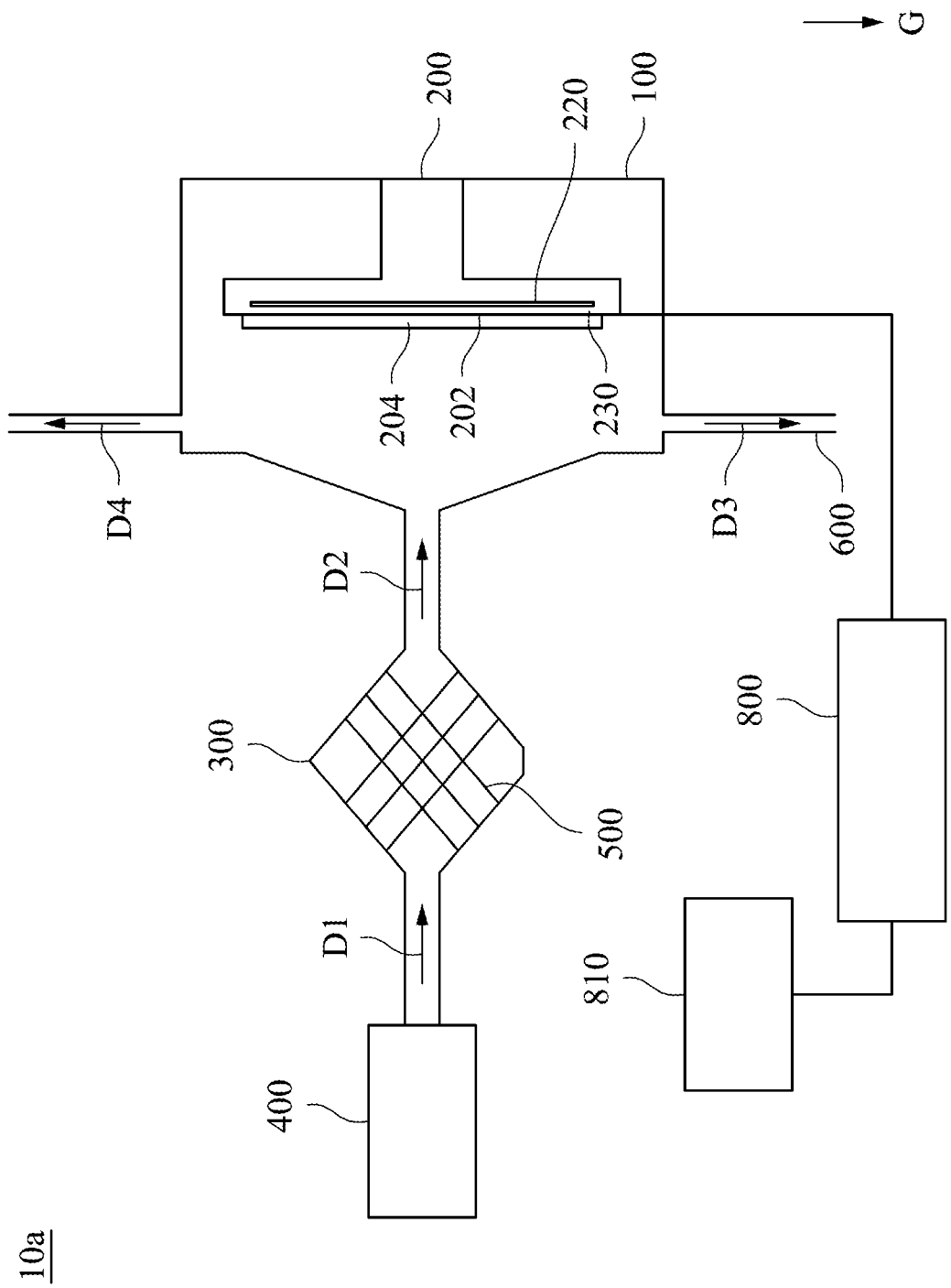
FIG. 5 is a schematic view of the etching device at another operation state in accordance with another embodiment of the present disclosure.

FIG. 4 is a schematic view of an etching device 10a at one operation state in accordance with another embodiment of the present disclosure, while FIG. 5 is a schematic view of the etching device 10a at another operation state in accordance with another embodiment of the present disclosure. Referring to FIG. 4, the etching device 10a includes the chamber 100, the wafer holder 200, the vacuum sealing device 300, the gas source 400, and the inductive coil 500. The wafer holder 200 is disposed in the chamber 100. The wafer holder 200 has the wafer-mounting surface 202 in parallel with the gravity direction G.

Referring to FIG. 5, FIG. 5 shows another operation state of the wafer 204 fixed on the wafer holder 200 by using an electrostatic chuck 230, and the etching process is performed. In greater detail, the wafer 204 is directly disposed on the wafer-mounting surface 202, and the wafer 204 is in parallel with the gravity direction G. In some embodiments, the electrostatic chuck 230 may be any appropriate type of electrostatic chuck 230. For example, the electrostatic chuck 230 may have one or more zones. A power supply unit 800 may be adapted for applying a voltage to a corresponding zone of the electrostatic chuck 230. Moreover, the control unit 810 may perform certain control functions. For example, the control unit 810 may be adapted for controlling power supply unit 800 to start or to stop applying the voltage to the corresponding zone of the electrostatic chuck 230. While the control unit 810 controls power supply unit 800 to start applying the voltage to the zone of the electrostatic chuck 230, the wafer 204 is fixed on the wafer holder 200.

In other words, when the electrostatic chuck 230 is controlled to hold a wafer 204, the power supply unit 800 provides a voltage to an electrode (not shown), and the electrode generate Coulomb force or Johnsen-Rahbek force between the wafer 204 and the electrode, such that the wafer 204 can be fixed on the wafer holder 200 by using the electrostatic chuck 230.

In summary, the disclosure provides a method and a device for performing an etching process. The wafer is disposed on the wafer-mounting surface of the wafer holder, and the wafer-mounting surface of the wafer holder is in parallel with a gravity direction, and thus particles may drop on a side surface of the wafer without staying on a top surface of the wafer. Therefore, the contamination problem on the top surface of the wafer can be resolved, and performance of the wafer can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method, comprising:
    disposing a wafer holder in a chamber, wherein the chamber has a bottom, a top, and a sidewall extending from the bottom of the chamber to the top of the chamber, and wherein the wafer holder is fixed on and in contact with the sidewall of the chamber such that a wafer-mounting surface of the wafer holder maintains parallel with a gravity direction;
    disposing a wafer on the wafer-mounting surface of the wafer holder;
    flowing gas from a gas source to a vacuum sealing device, wherein an inductive coil wrapping around the vacuum sealing device excites the gas into plasma;
    injecting the plasma to the wafer; and
    performing a first purging operation through an exhaust pipe connected to a first end and a second end of the vacuum sealing device, wherein the exhaust pipe is made of a same material as that of the vacuum sealing device, and the exhaust pipe and the vacuum sealing device are made of a ceramic material.

2. The method of claim 1, further comprising:
    performing a second purging operation through at least one exhaust pipe connected to the chamber, while the wafer is disposed on the wafer holder.

3. The method of claim 1, further comprising:
    removing the wafer; and
    performing a clean operation after removing the wafer.

4. The method of claim 3, wherein performing the clean operation further comprises:
    disposing a blocking membrane between the vacuum sealing device and the chamber, such that the vacuum sealing device is separate from the chamber.

5. The method of claim 1, wherein the vacuum sealing device has a first wall and a second wall opposite to the first wall, and wherein the inductive coil extends from the first wall of the vacuum sealing device to the second wall of the vacuum sealing device.

* * * * *